(12) United States Patent
Frougier et al.

(10) Patent No.: US 11,094,794 B2
(45) Date of Patent: Aug. 17, 2021

(54) AIR SPACER STRUCTURES

(71) Applicant: GLOBALFOUNDRIES U.S. INC., Santa Clara, CA (US)

(72) Inventors: Julien Frougier, Albany, NY (US); Ali Razavieh, Saratoga Springs, NY (US); Haiting Wang, Clifton Park, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/585,671

(22) Filed: Sep. 27, 2019

(65) Prior Publication Data

US 2021/0098591 A1    Apr. 1, 2021

(51) Int. Cl.
| | |
|---|---|
| *H01L 29/49* | (2006.01) |
| *H01L 29/08* | (2006.01) |
| *H01L 29/66* | (2006.01) |
| *H01L 29/51* | (2006.01) |
| *H01L 21/764* | (2006.01) |
| *H01L 21/768* | (2006.01) |
| *H01L 21/306* | (2006.01) |

(52) U.S. Cl.
CPC .... *H01L 29/4991* (2013.01); *H01L 21/30621* (2013.01); *H01L 21/76829* (2013.01); *H01L 29/0847* (2013.01); *H01L 29/6656* (2013.01)

(58) Field of Classification Search
CPC ............. H01L 29/4991; H01L 29/6656; H01L 21/76829; H01L 29/0847
See application file for complete search history.

(56) References Cited

U.S. PATENT DOCUMENTS

| | | |
|---|---|---|
| 5,869,379 A | 2/1999 | Gardner et al. |
| 7,741,663 B2 | 6/2010 | Hause et al. |
| 9,735,246 B1 | 8/2017 | Basker et al. |
| 10,395,988 B1* | 8/2019 | Cheng ............... H01L 29/66545 |
| 2015/0243544 A1 | 8/2015 | Alptekin et al. |
| 2018/0033863 A1 | 2/2018 | Xie et al. |
| 2018/0047615 A1* | 2/2018 | Cheng ............... H01L 29/66795 |
| 2019/0334009 A1* | 10/2019 | Cheng ............... H01L 29/66795 |

* cited by examiner

*Primary Examiner* — Omar F Mojaddedi
(74) *Attorney, Agent, or Firm* — Francois Pagette; Andrew M. Calderon; Roberts Calderon Safran & Cole, P.C.

(57) ABSTRACT

The present disclosure generally relates to semiconductor structures and, more particularly, to air spacer structures and methods of manufacture. The structure includes: a plurality of gate structures comprising active regions; contacts extending to the active regions; a plurality of anchor structures between the active regions; and air spacer structures adjacent to the contacts.

8 Claims, 11 Drawing Sheets

AIR SPACER STRUCTURES

FIELD OF THE INVENTION

The present disclosure generally relates to semiconductor structures and, more particularly, to air spacer structures and methods of manufacture.

BACKGROUND

As semiconductor processes continue to scale downwards, e.g., shrink, the desired spacing between features (i.e., the pitch) also becomes smaller. To this end, in the smaller technology nodes it becomes ever more difficult to fabricate features due to the critical dimension (CD) scaling and process capabilities.

In radio frequency (RF) applications, device performance is limited by parasitic gate-to-source/drain (S/D) capacitance. This is because high-frequency performance metrics, e.g., Ft and Fmax, of RF transistors are inversely proportional to values of gate structure to S/D contact capacitances, i.e., gate to drain capacitance ($C_{gd}$) and gate to source capacitance ($C_{gs}$). The parasitic gate-to-S/D capacitance can emerge from: (i) the spacer material of the gate structure; and (ii) a relatively low-quality oxide flowable chemical vapor deposition (FCVD) between the metal stack of the gate structure and the metal fill of the S/D contacts.

Conventional devices which attempt to address parasitic gate-to-S/D capacitance involve a self-aligned contact (SAC) integration flow. However, a SAC flow is not necessarily the integration of choice for technology nodes with relatively larger contacted poly pitches (CPPs), as the space between gate structures is large enough to reliably form the trench contacts using only patterning and etch processes. Hence, by-passing the requirement of self-aligning the trench contacts to the gate structures. An example of such relaxed CPP devices can be found in RF technology where the space between adjacent gate structures remains large enough not to require a SAC integration flow. For RF devices, the trench contacts are directly etched into the low quality FCVD oxide. However, most of the proposed airgap spacer integrations are derived from SAC flows and are not necessarily compatible with relaxed CPP integrations. This invention offers a solution to this problem.

SUMMARY

In an aspect of the disclosure, a structure comprises: a plurality of gate structures comprising active regions; contacts extending to the active regions; a plurality of anchor structures between the active regions; and air spacer structures adjacent to the contacts.

In an aspect of the disclosure, a structure comprises: a plurality of gate structures comprising source and drain (S/D) regions; contacts extending to the S/D regions; a plurality of anchor structures between the S/D regions; and air spacer structures adjacent to the contacts and the anchor structures.

In an aspect of the disclosure, a method comprises: forming at least one gate structure; forming a plurality of active regions adjacent to the at least one gate structure; forming a dual liner encapsulating the at least one gate structure and the active regions; depositing an insulator material over the dual liner; forming a plurality of anchor structures between the active regions; forming a plurality of contacts in electrical contact with the active regions; etching at least one liner of the dual liner; etching select portions of the insulator material to form at least one airgap; and depositing a second liner within the airgaps to form air spacer structures.

BRIEF DESCRIPTION OF THE DRAWINGS

The present disclosure is described in the detailed description which follows, in reference to the noted plurality of drawings by way of non-limiting examples of exemplary embodiments of the present disclosure.

FIGS. 9A-10B show alternative structures and respective fabrication processes in accordance with aspects of the present disclosure.

DETAILED DESCRIPTION

The present disclosure generally relates to semiconductor structures and, more particularly, to air spacer structures and methods of manufacture. In embodiments, the processes and structures provided herein utilize liners and anchors to form airgaps for air spacer structures between the gate structures and the source/drain (S/D) contacts. Advantageously, by forming air spacer structures, parasitic gate-to-S/D capacitance can be reduced due to the low-k nature of air, thereby improving radio frequency (RF) device performance.

The processes and structures described herein allow for the permittivity of spacers between gate structures and S/D contacts to be engineered in a specific manner for lowering the parasitic gate-to-S/D capacitance to target values needed for RF technologies, i.e., lowering the gate to drain capacitance ($C_{gd}$) and gate to source capacitance ($C_{gs}$). In embodiments, forming relatively large air spacer structures allows for these RF target values, e.g., Ft and Fmax of RF transistors, to be achieved as Ft and Fmax are inversely proportional to values of capacitances of gate structure to S/D contacts, i.e., $C_{gd}$ and $C_{gs}$. In further embodiments, the processes and structures described herein are compatible with non-self-aligned contact (SAC) processes and can be applied to any contacted poly pitch (CPP), which can be critical for RF FinFETs. In this way, the structures and processes described herein improve the overall performance of RF devices at any CPP.

A method includes forming a dual (bottom liner and top liner) contact etch stop liner (CESL) liner to encapsulate gate structures of the device. Anchor structures are formed between the active regions of the device, i.e., S/D regions, while an interlevel dielectric cap is formed over the CESL liner from a same material as the anchor structures. The method further includes a selective etching to etch the top liner of the dual CESL liner for access to the interlevel dielectric. The interlevel dielectric is selectively etched to remove the interlevel dielectric between the gate structures and the S/D contacts, thereby forming airgaps. Relatively large air spacer structures are formed from the airgaps by depositing a conformal low-k liner within the airgaps.

A structure includes air spacer structures having a relatively large airgap between a spacer of the gate structure and the S/D contacts. The structure exhibits no airgap in the spacers of the gate structure. Further, an airgap cap is in contact with the S/D contacts and a spacer of the gate structure. In embodiments, the structure includes a single airgap or double airgaps encapsulated in-between dielectric pillars of the anchor structures, the S/D regions and the S/D contacts. Additionally, the S/D contacts are anchored by the dielectric pillars of the anchor structures, with the anchor structures in-between active regions.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1A:
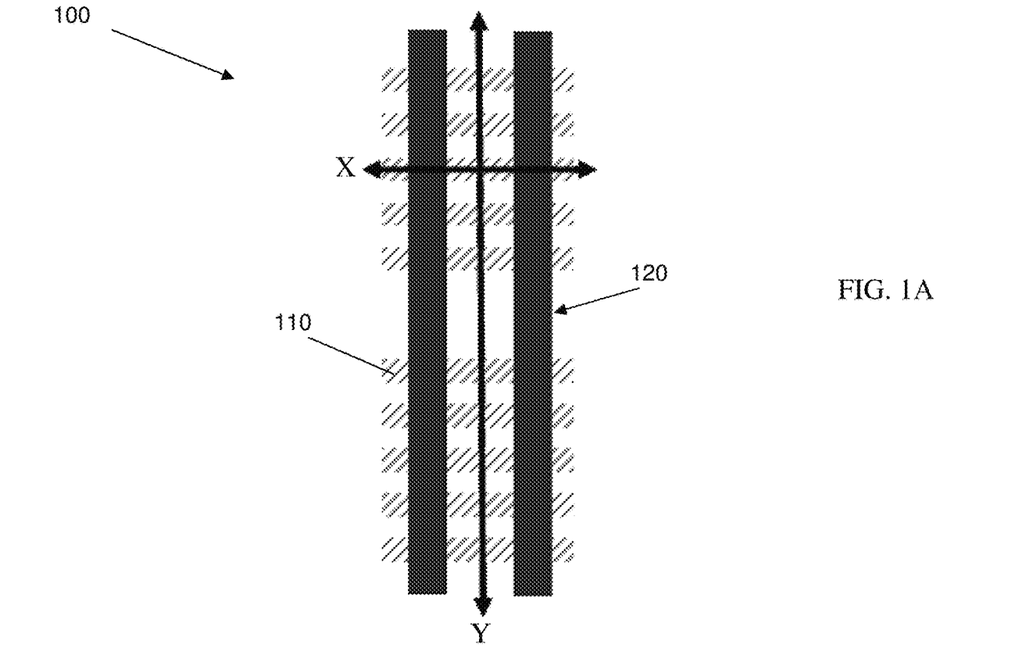
FIGS. 1A-1C show dummy gate structures, amongst other features, and respective fabrication processes in accordance with aspects of the present disclosure.
Figure 1B:
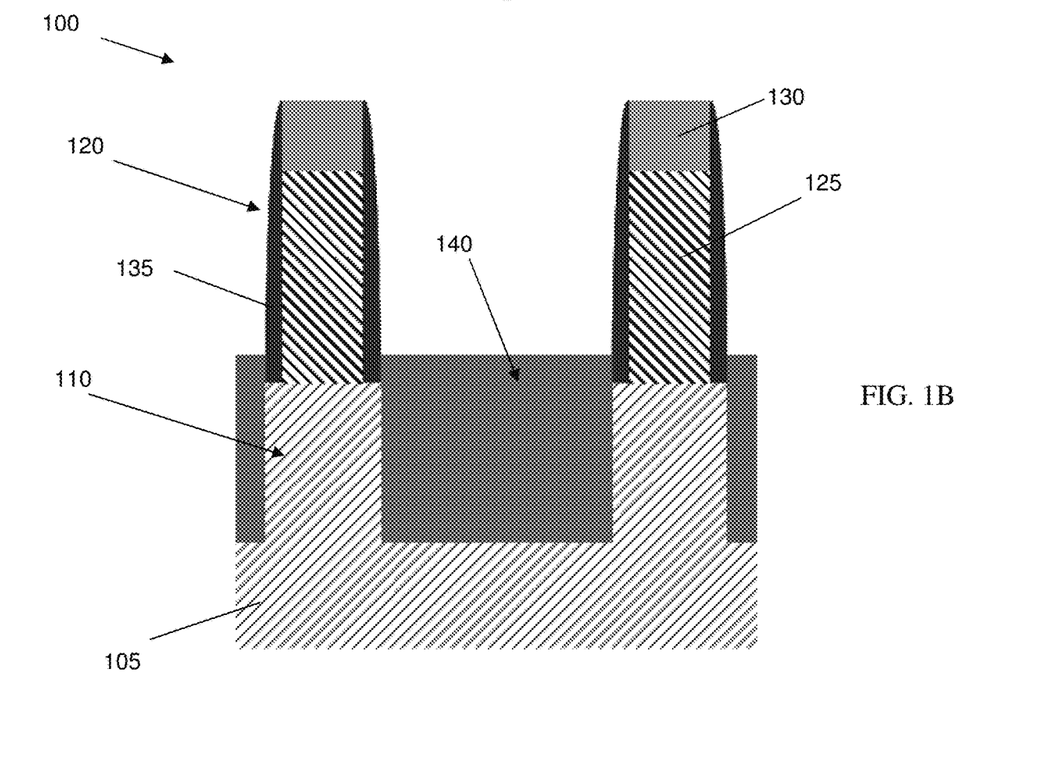
Figure 1C:
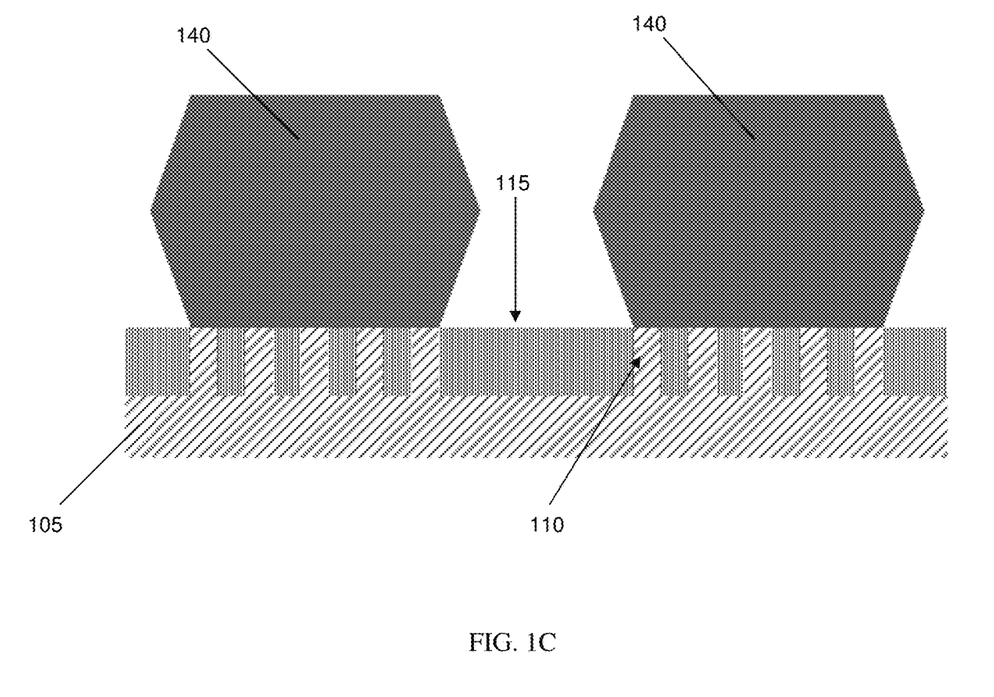

FIGS. 1A-1C show an incoming structure and respective fabrication processes in accordance with aspects of the present disclosure. Specifically, FIG. 1A depicts a top view of a structure 100, FIG. 1B depicts the structure 100 along an X-axis and FIG. 1C depicts the structure 100 along a Y-axis. Referring to FIGS. 1A-1C, the structure 100 comprises fin structures 110 composed of a suitable semiconductor material 105. For example, the fin structures 110 may be composed of any suitable semiconductor material 105 including, but not limited to, Si, SiGe, SiGeC, SiC, GaAs, InAs, InP, etc.

The fin structures 110 can be fabricated using a sidewall image transfer (SIT) technique. In an example of a SIT technique, a mandrel material, e.g., $SiO_2$, is deposited on a substrate using conventional chemical vapor deposition (CVD) processes. A resist is formed on the mandrel material and exposed to light to form a pattern (openings). A reactive ion etching (RIE) is performed through the openings to form the mandrels. In embodiments, the mandrels can have different widths and/or spacing depending on the desired dimensions of the fin structures. Spacers are formed on the sidewalls of the mandrels which are preferably material that is different than the mandrels, and which are formed using conventional deposition processes known to those of skill in the art. The spacers can have a width which matches the dimensions of the fin structures, for example. The mandrels are removed or stripped using a conventional etching process, selective to the mandrel material. An etching is then performed within the spacing of the spacers to form the sub-lithographic features, e.g., fin structures. The sidewall spacers can then be stripped.

Still referring to FIGS. 1A-1C, gate structures 120 are formed on the fin structures 110 and on shallow trench isolation (STI) regions 115. The STI regions 115 can be formed by conventional etching and deposition processes, followed by a planarization process, e.g., chemical mechanical planarization (CMP). In embodiments, the gate structures 120 are composed of a dummy gate material 125, e.g., amorphous Si (α-Si), and a capping layer 130. The capping layer 130 can be formed of any suitable hardmask material, e.g., SiN, amongst other examples.

The dummy gate material 125 and the capping layer 130 are deposited by CVD, followed by conventional patterning steps. The gate structures 120 further include sidewall spacers 135, e.g., a low-k dielectric, which can be deposited on sidewalls of the patterned materials 125, 130. The sidewall spacers 135 can be deposited by conventional chemical vapor deposition (CVD) processes followed by a patterning process, e.g., anisotropic etching process, to remove any material from horizontal surfaces of the structure 100.

Source and drain regions (S/D) regions 140 are formed on sides of the gate structures 120, e.g., sides of the sidewall spacers 135, on the fin structures 110 using, e.g., any conventional method. For example, the S/D regions 140 can be raised S/D regions formed by a doped epitaxial growth of materials on the surfaces of the fin structures 110, within openings between the gate structures 120. In further embodiments, the S/D regions 140 can be formed by an ion implantation process, doping process or through a diffusion processes, as is well known to those of skill in the art such that no further explanation is required for an understanding of the present disclosure.

Figure 2A:
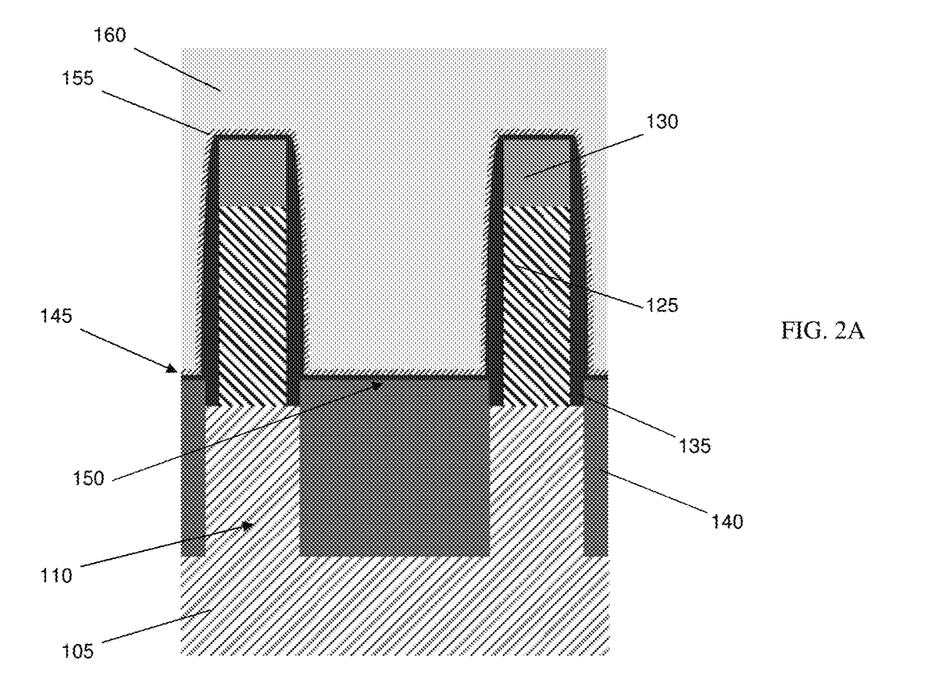
FIGS. 2A and 2B show a bottom and a top contact etch stop liner (CESL), amongst other features, and respective fabrication processes in accordance with aspects of the present disclosure.
Figure 2B:
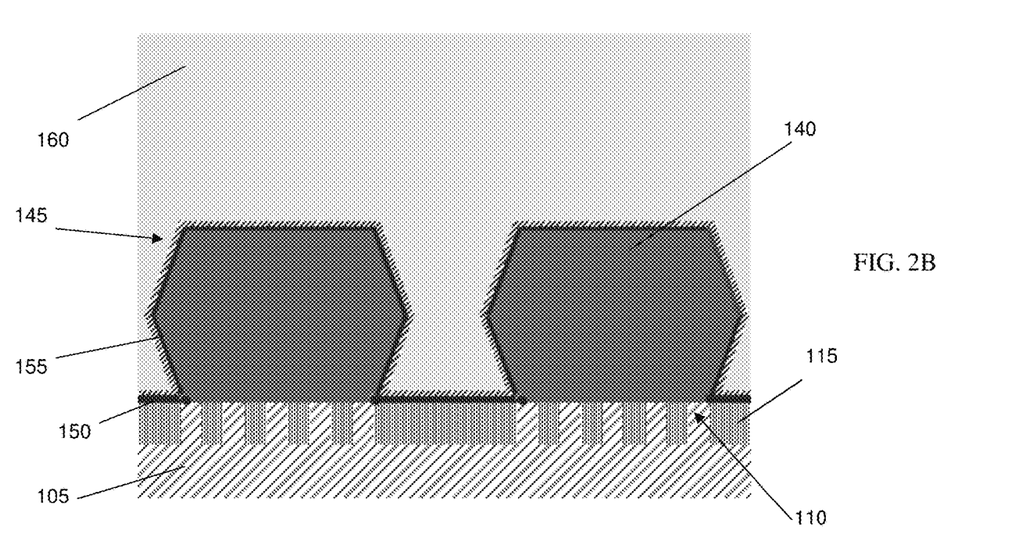

FIGS. 2A and 2B show a dual contact etch stop liner (CESL) 145 deposited over the gate structures 120 and the S/D regions 140. In embodiments, the dual CESL liner 145 can be comprised of a bottom liner 150 and a top liner 155. In this way, the etch stop liner is a dual etch stop liner, i.e., dual CESL liner 145, comprising a bottom liner 150 and a top liner 155. The bottom liner 150 can be composed of any suitable low-k material, e.g., SiBCN. In further embodiments, the bottom liner 150 can be composed of the same material low-k material as the sidewall spacers 135. The top liner 155 can also be composed of a low-k material, e.g., SiN. Accordingly, the bottom liner and the top liner are composed of a low-k material. The bottom liner 150 and the top liner 155 can be deposited by ALD or CVD processes.

The bottom liner 150 and the top liner 155 can each have a thickness in a range of 2 nm to 5 nm. In this way, the dual CESL liner 145 can be formed to have a thickness in a range of about 4 nm to 10 nm; although other dimensions are contemplated herein. An interlevel dielectric (ILD) 160 is deposited over the S/D regions 140 and the dual CESL liner 145. The ILD 160 can be deposited by CVD processes and is composed of oxide, for example. After deposition, the ILD 160 is planarized by a CMP process to a level of the capping layer 130, thereby removing the dual CESL liner 145 directly over the capping layer 130.

Figure 3A:
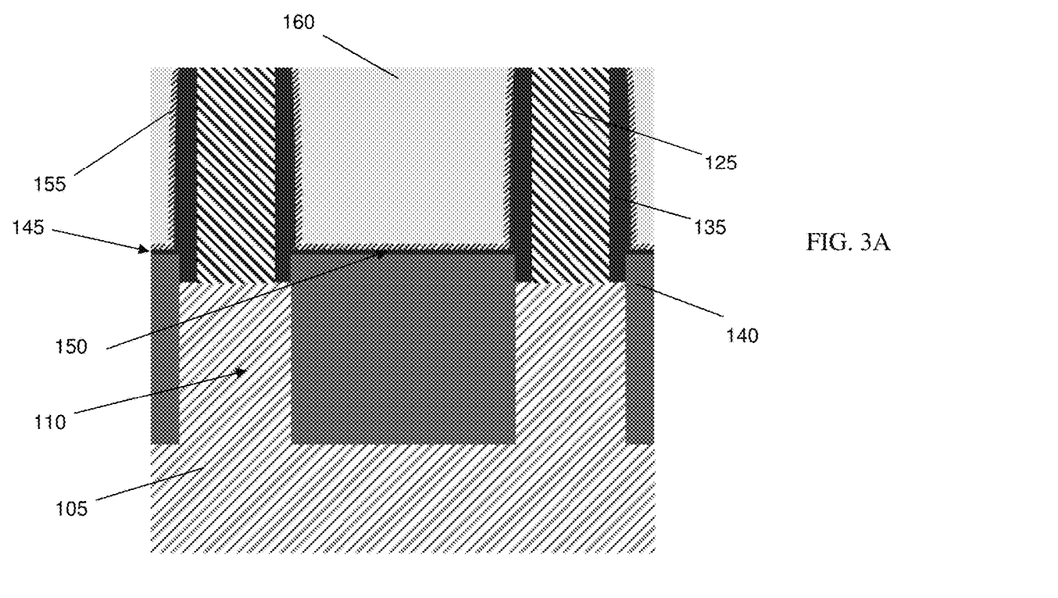
FIGS. 3A and 3B show anchor structures, amongst other features, and respective fabrication processes in accordance with aspects of the present disclosure.
Figure 3B:
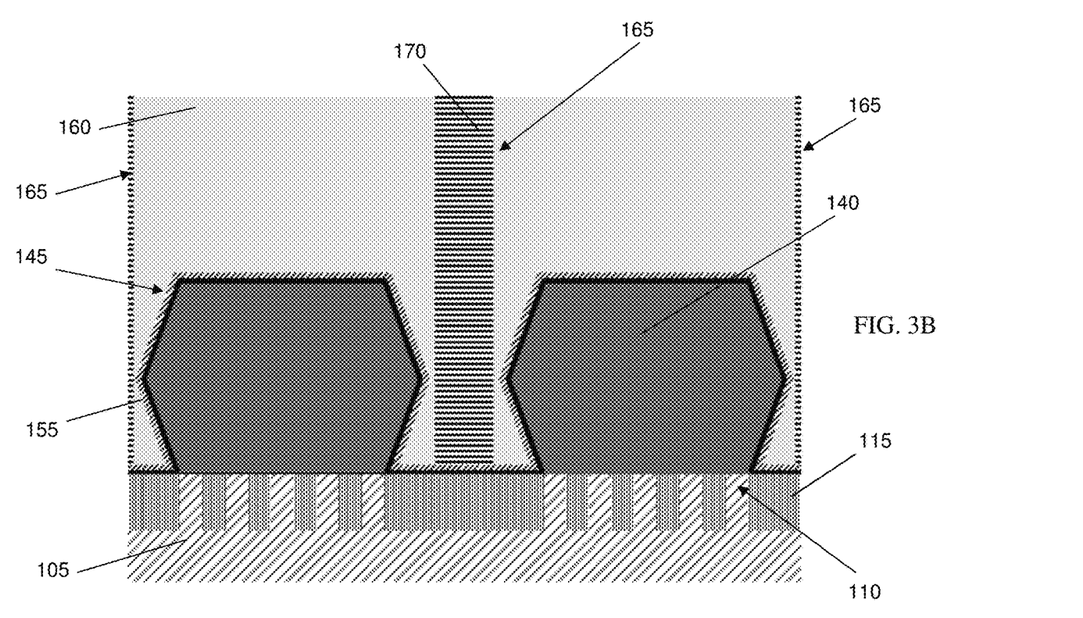

FIGS. 3A and 3B show anchor structures 165 formed in-between the active regions of the device. In embodiments, an organic planarization layer (OPL) is applied by a spin-coating process to blanket-deposit the OPL material over a top surface of the ILD 160 and a top surface of the capping layer 130. A selective etching process, e.g., RIE, patterns the ILD 160 to form a trench within the ILD 160. The OPL material is etched away by a conventional etching process, e.g., oxygen ashing process.

An anchor structure 165 is formed within the trench of the ILD 160 between the active regions, i.e., S/D regions 140, and over the dual CESL liner 145, by the deposition of a fill material 170 within the trench by ALD or CVD processes. In this way, the structure includes an etch stop liner, i.e., dual CESL liner 145, beneath the anchor structures 165. In embodiments, the fill material 170 can be composed of SiC and can be polished by a CMP process, which stops on the ILD 160 due to the selectivity between the fill material 170 and the ILD 160.

In embodiments, the anchor structures 165 prevent the structure 100 from collapsing during subsequent etching of the bottom liner 150, the top liner 155 and/or the ILD 160. Following formation of the anchor structures 165, the capping layer 130 is etched (removed) using conventional etching techniques, e.g., RIE process. In this way, the dummy gate material 125 is left exposed. In alternative embodiments, the anchor structures 165 can be formed after formation of replacement gate structures.

Figure 4A:
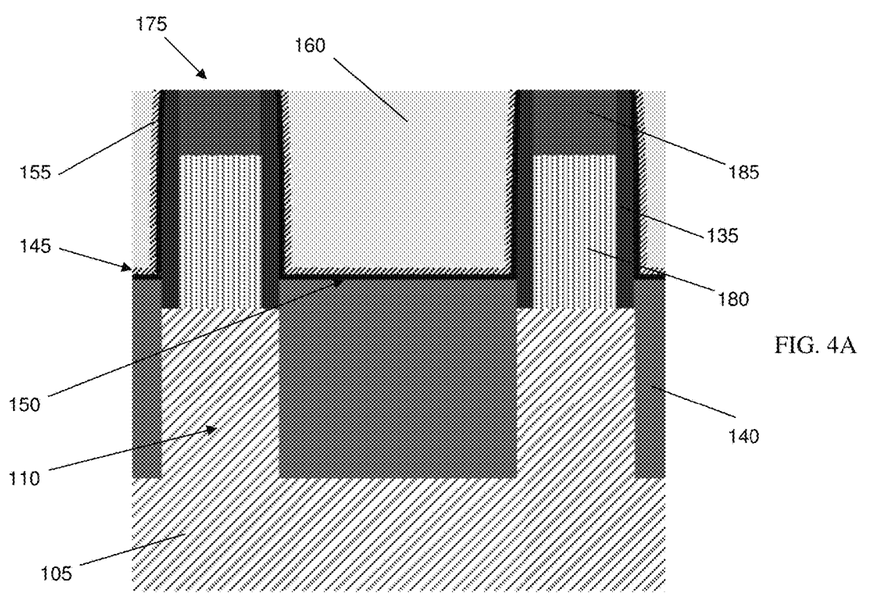
FIGS. 4A and 4B show replacement gate structures, amongst other features, and respective fabrication processes in accordance with aspects of the present disclosure.
Figure 4B:
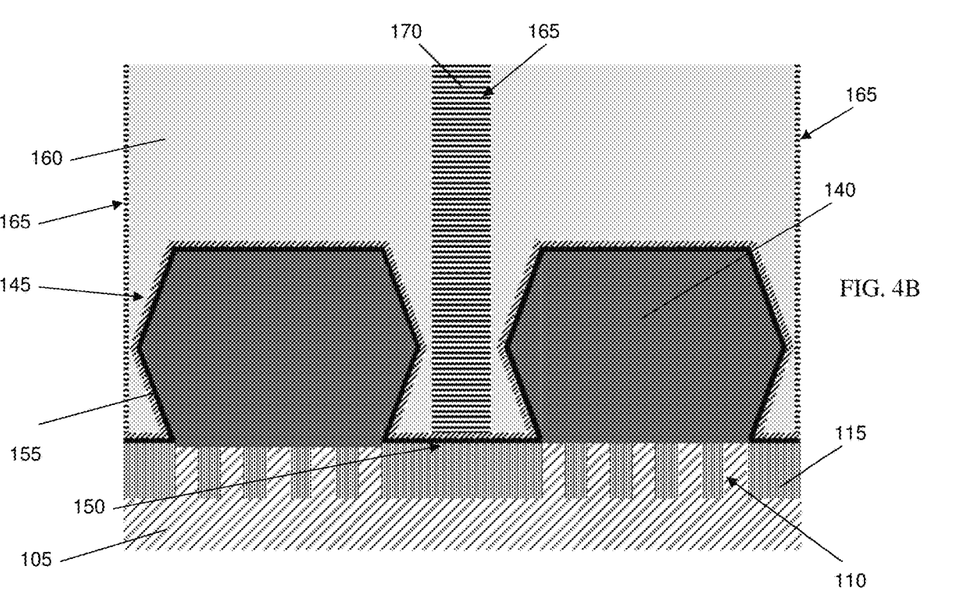

FIGS. 4A and 4B show replacement gate structures 175 formed over the fin structures 110. In embodiments, the dummy gate material 125 is removed by conventional etching techniques, e.g., RIE process. In this way, the gate structures 175 comprise sidewall spacers 135 and a etch stop liner, i.e., dual CESL liner 145, adjacent to the sidewall spacers 135. The replacement gate structures 175 include a gate stack 180, which includes a dielectric material and a gate metal.

The gate dielectric material can be, e.g., a high-k gate dielectric material, e.g., hafnium-based dielectrics. In embodiments, the high-k dielectric materials can include, but are not limited: $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The gate metal of the gate stack 180 can include any metal or any combination of metals, e.g., TiN, TiC, tungsten (W), depending on the particular application and design parameters. A gate cap 185 is deposited over the gate stack 180. In embodiments, the gate stack 180 and the gate cap 185 can be deposited using a CVD process between the sidewall spacers 135, followed by a CMP process.

Figure 5A:
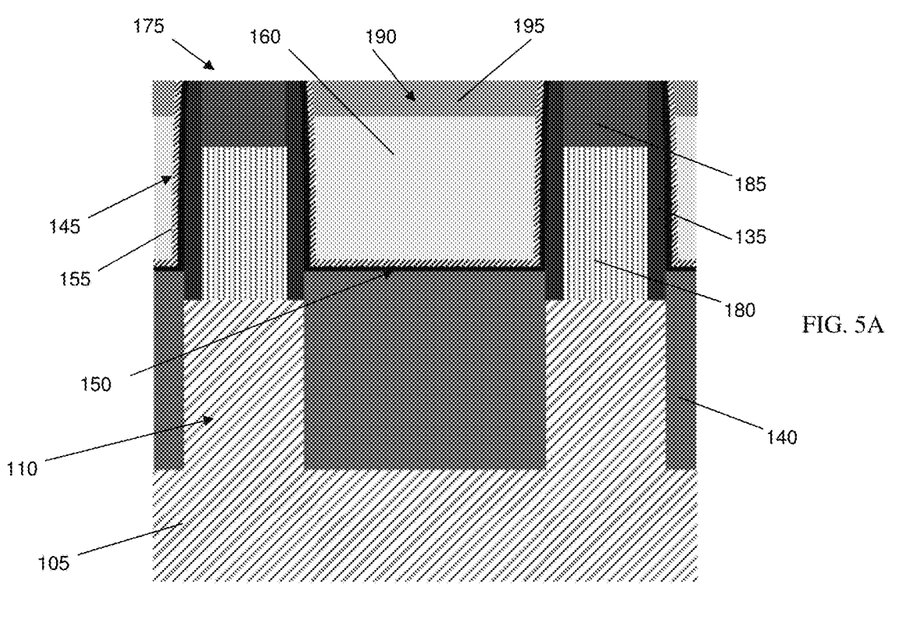
FIGS. 5A and 5B show an airgap capping layer, amongst other features, and respective fabrication processes in accordance with aspects of the present disclosure.
Figure 5B:
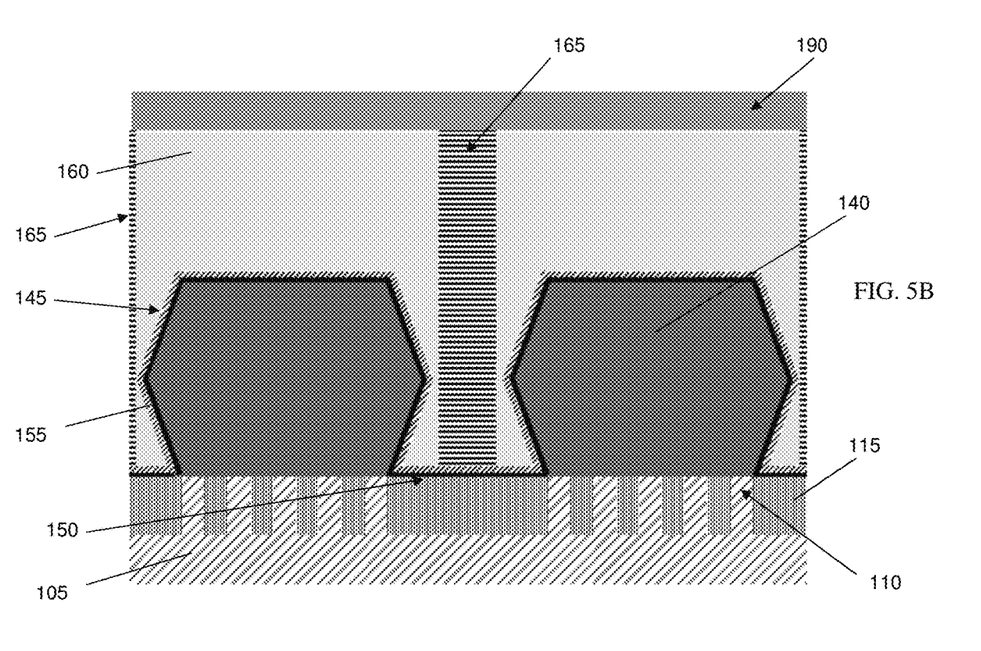

FIGS. 5A and 5B show an airgap cap 190 deposited over the ILD 160 and the anchor structures 165. In embodiments, prior to the deposition of the airgap cap 190, the ILD 160 is recessed by a selective RIE process, thereby forming a trench. The trench is filled with a material 195 to form the airgap cap 190, which is deposited by a CVD process, followed by a CMP process. In embodiments, the material 195 is the same as material as the fill material 170 of the anchor structures 165, i.e., SiC. In this way, the cap, i.e., airgap cap 190, is composed of a same material as the anchor structures 165.

Figure 6A:
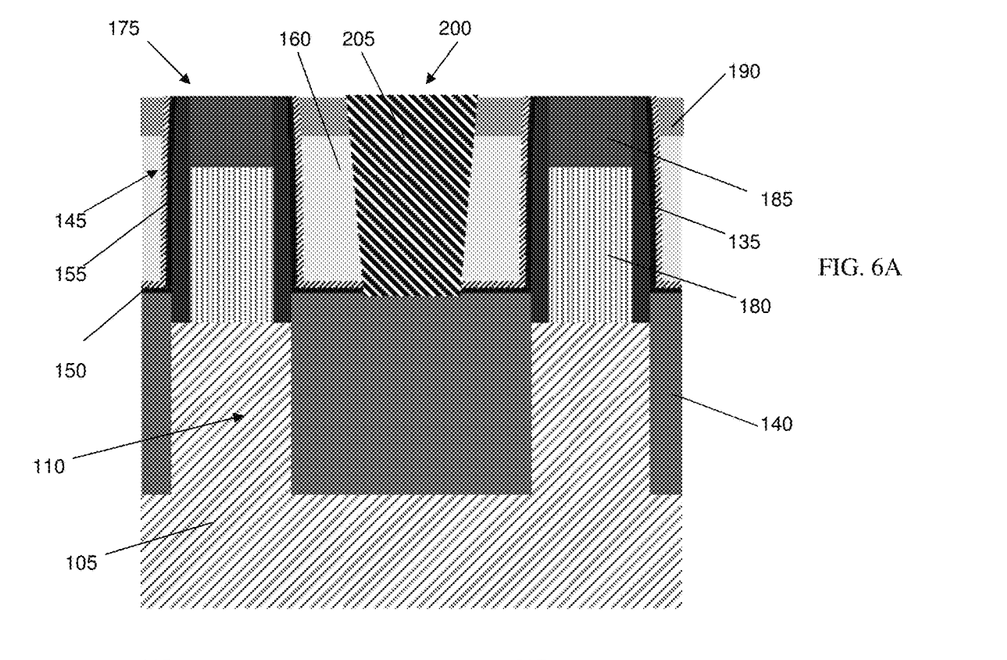
FIGS. 6A and 6B show source/drain (S/D) metallization features, amongst other features, and respective fabrication processes in accordance with aspects of the present disclosure.
Figure 6B:
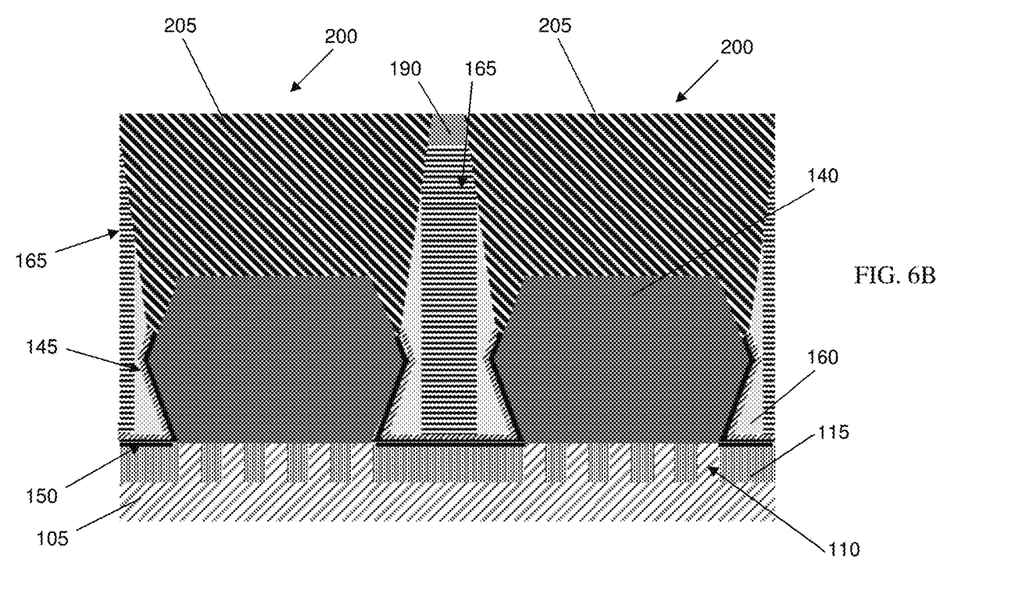

FIGS. 6A and 6B show the S/D contacts 200, amongst other features. In embodiments, trenches are formed in the ILD 160 using conventional lithography and etching techniques, e.g., RIE process. In embodiments, the trench formation can be a maskless process due to the materials being implemented. The etching exposes the dual CESL liner 145 over the S/D regions 140 for subsequent etching of the S/D regions 140 with selective chemistries.

In embodiments, trenches are formed by selective etching of the airgap cap 190 and ILD 160 using a RIE process, thereby exposing the dual CESL liner 145. The dual CESL liner 145 is then etched from the top surface of the S/D regions 140, thereby exposing the S/D regions 140. The removal of the dual CESL liner 145 can be a maskless process performed by either a wet etch or a dry etch, which uses chemistries to remove the material of the liners 150, 155 (selective to the remaining materials), for example. The S/D contacts 200 will be formed in contact with the exposed portions of the S/D regions 140. More specifically, the metal material 205 of the S/D contacts 200 will directly contact the S/D regions 140.

A salicide liner is deposited in the trenches over the S/D regions 140 and is then subjected to a silicide process. As should be understood by those of skill in the art, the silicide process begins with deposition of a thin transition metal layer, e.g., nickel, cobalt or titanium, over fully formed and patterned semiconductor devices (e.g., S/D regions 140). After deposition of the material, the structure is heated, allowing the transition metal to react with exposed silicon (or other semiconductor material as described herein) in the active regions of the semiconductor device (e.g., source, drain, gate contact region) to form a low-resistance transition metal silicide. Following the reaction, any remaining transition metal is removed by chemical etching, leaving silicide contacts in the active regions of the device. It should be understood by those of skill in the art that silicide contacts will not be required on the devices, when a gate structure is composed of a metal material.

The salicide liner can be deposited using physical vapor deposition (PVD) or CVD processes. Following the silicide process, a metal material 205 is deposited on the transition metal silicide, thereby forming the S/D contacts 200. The S/D contacts 200 are formed in contact with the exposed portions of the S/D regions 140. More specifically, the metal material 205 of the S/D contacts 200 directly contacts the S/D regions 140. The metal material 205 can be composed of cobalt (Co) or tungsten (W) or Ruthenium (Ru), for example.

The deposition of the metal material 205 is followed by a CMP process to the material of the gate cap 185. In this way, the formation of the S/D contacts 200 is a non-self-aligned contact (SAC) process. In embodiments, the S/D contacts 200 are anchored by the anchor structures 165, thereby providing further stability to the S/D contacts 200 during subsequent etching processes. Specifically, the contacts 200 are anchored into the anchor structures 165.

Figure 7A:
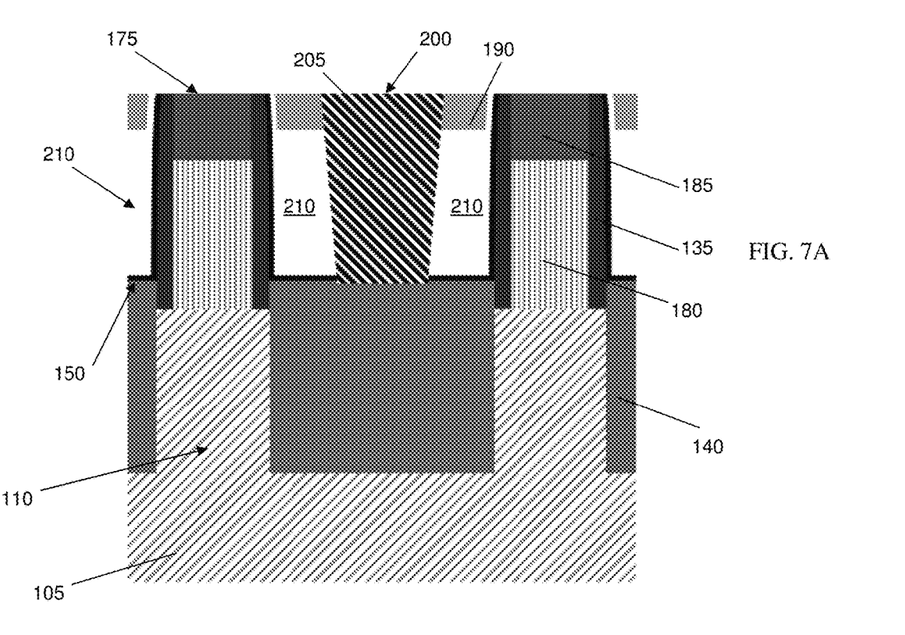
FIGS. 7A and 7B show airgaps, amongst other features, and respective fabrication processes in accordance with aspects of the present disclosure.
Figure 7B:
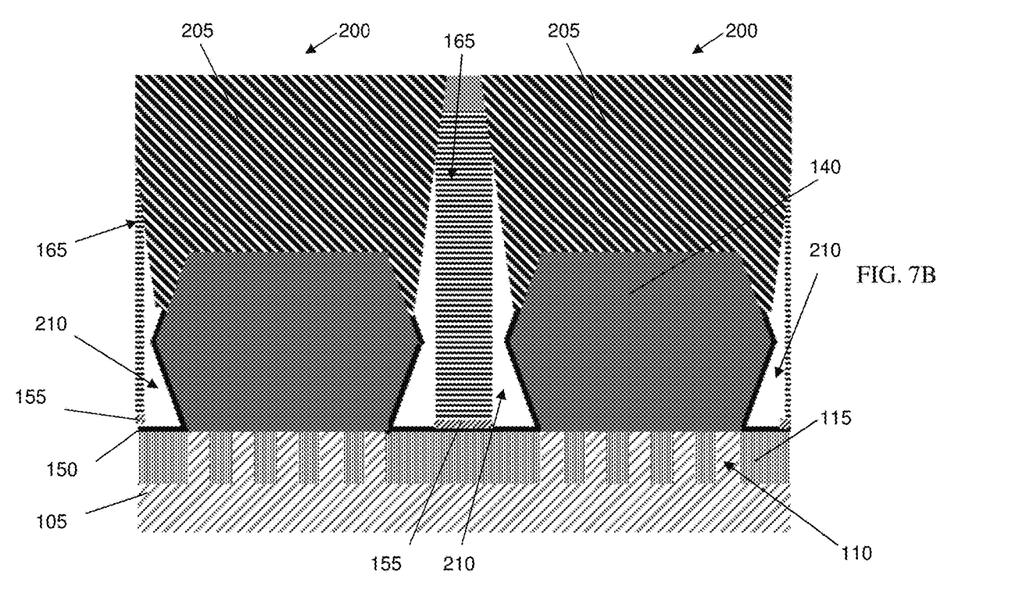

FIGS. 7A and 7B show airgaps 210 formed by the removal of the top liner 155 of the dual CESL liner 145 and select portions of the ILD 160. In embodiments, the removal of the top liner 155 is a maskless process performed by a vapor phase etch, which uses selective chemistries to remove the material of the top liner 155 (selective to the $SiO_2$ material of the ILD 160, the SiC material of the anchor structures 165 and the low-k material SiBCN of the bottom liner 150), for example.

The $SiO_2$ material of the ILD 160 is removed using a select etching, e.g., vapor phase etch, selective to the SiC material of the anchor structures 165 and the low-k material SiBCN of the bottom liner 150. Specifically, select portions of the ILD 160 between the replacement gate structures 175 and the S/D contacts 200 are etched away, while other portions of the ILD 160 remain. In this way, airgaps 210 are formed between the replacement gate structures 175 and the S/D contacts 200, while the bottom liner 150 of the dual CESL liner 145 remains intact. In embodiments, a portion of the top liner 155 and a portion of the bottom liner 150 are both covered by the anchor structures 165, and therefore remain beneath the anchor structures 165. In this way, the etch stop liner, i.e., dual CESL liner 145, extends beneath the anchor structures 165.

In embodiments, the dielectric pillars of the anchor structures 165 provide stability to the structure 100 by anchoring the S/D contacts 200 in the anchor structures, thereby preventing a collapse in the layers of the device. Accordingly, the structure 100 does not collapse from the weight of the S/D contacts 200 when the select portions of the ILD 160 are removed.

Figure 8A:
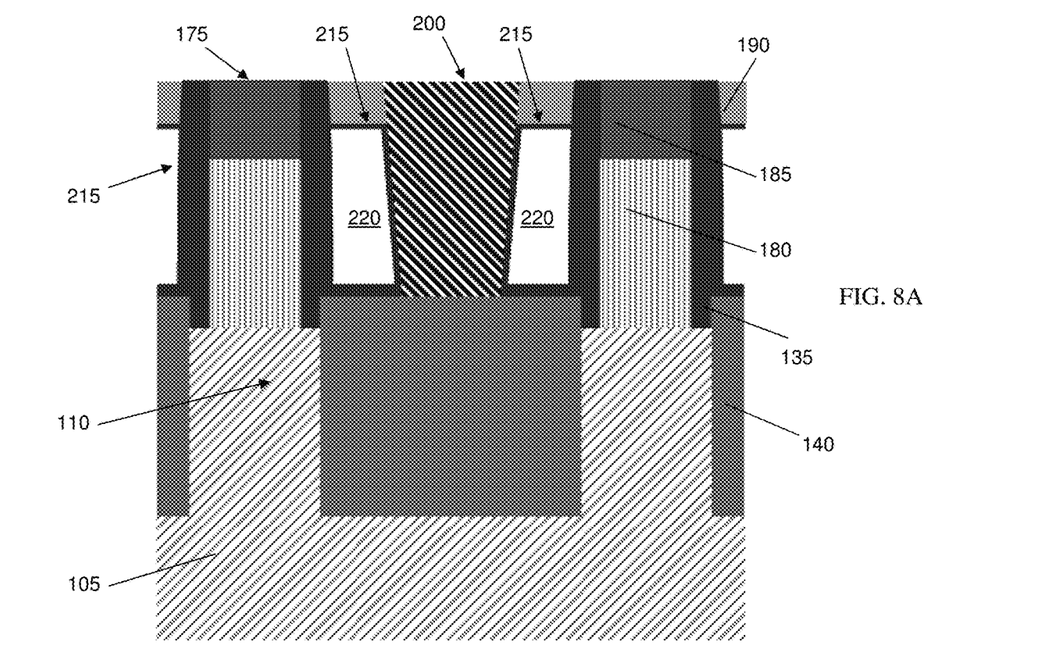
FIGS. 8A and 8B show air spacer structures, amongst other features, and respective fabrication processes in accordance with aspects of the present disclosure.
Figure 8B:
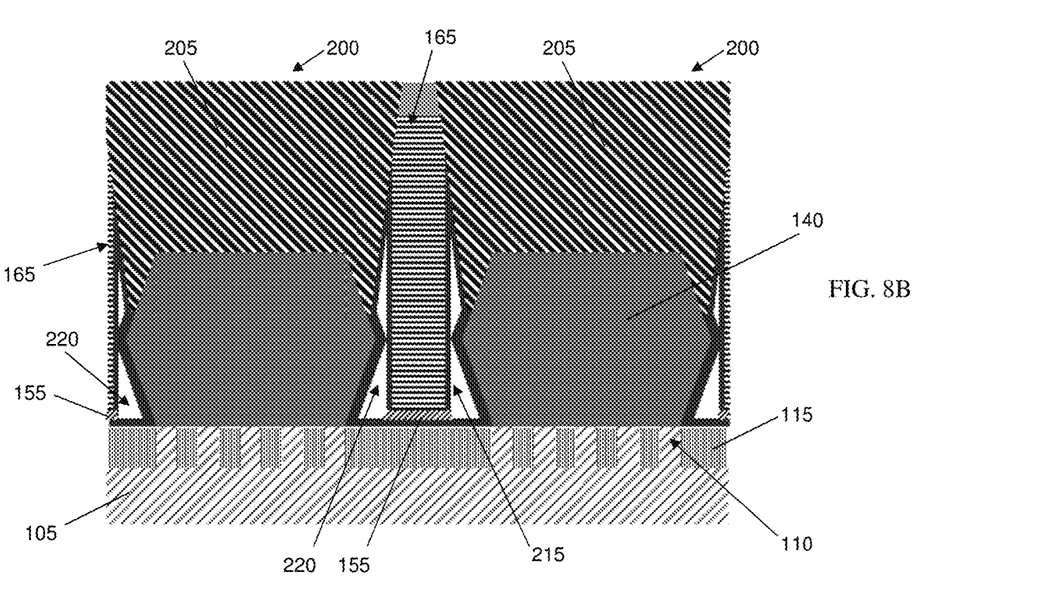
Figure 9A:
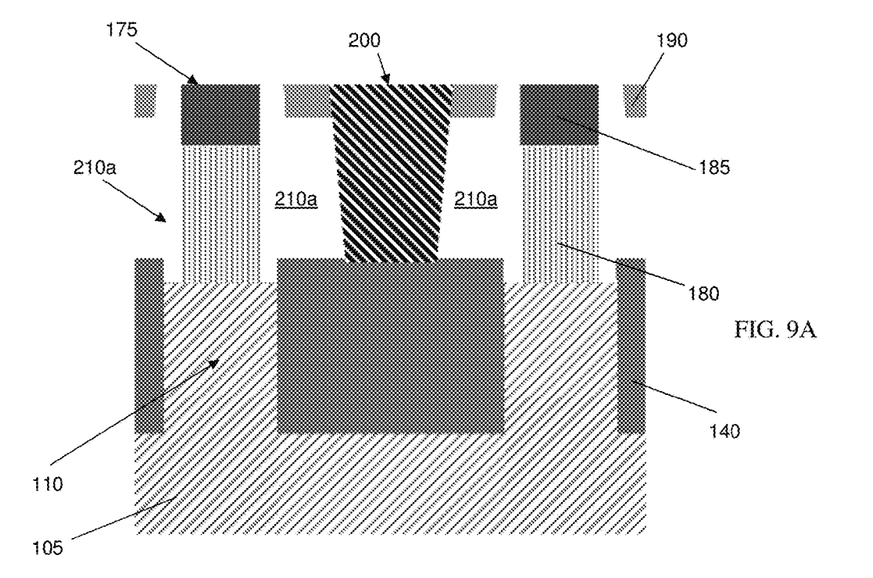
Figure 9B:
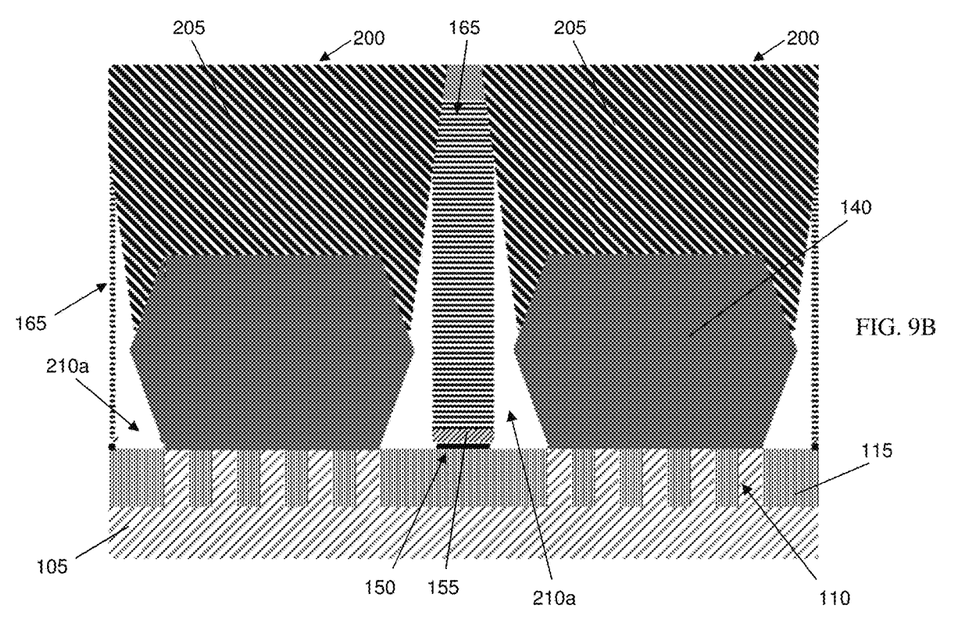

FIGS. 8A and 8B show the formation of air spacer structures 220, i.e., single or dual airgap structures. Accordingly, the structures and processes described herein include a plurality of gate structures 175 comprising active regions, i.e., S/D regions 140, and contacts 205 extending to the active regions. Further, the structure includes a plurality of anchor structures 165 between the active regions, and air spacer structures 220 adjacent to the contacts 205.

The air spacer structures 220 are formed by a deposition of a low-k liner 215 on sidewalls of the airgaps 210 to form the air spacer structures 220, followed by an isotropic etch back process. In this way, the air spacer structures 220 comprise a liner, i.e., low-k liner 215, and airgaps 210. The low-k liner 215 can be composed of any suitable low-k material, e.g., SiBCN, deposited by a CVD process, as an example. In embodiments, the deposition of the low-k liner 215 encapsulates the airgaps 210 to form the air spacer structures 220. Accordingly, the air spacer structures 220 comprise airgaps 210 between the gate structures 175 and the contacts 200. In embodiments, the low-k liner 215 lines the anchor structures 165, and the airgap cap 190 is over the air spacer structures 220.

The low-k nature of air contained within the air spacer structures 220 allows for a reduction in the parasitic gate-to-S/D capacitance, thereby improving RF device performance. Further, the airgap cap 190 over the air spacer structures 220 allows for further integrity of the air spacer structures 220. In this way, a structure includes a plurality of gate structures 175 comprising source and drain (S/D) regions 140, with contacts 200 extending to the S/D regions 140. Further, a plurality of anchor structures 165 are between the S/D regions 140, with air spacer structures 220 adjacent to the contacts 205 and the anchor structures 165.

The processes and structures described herein allow for the permittivity of spacer structures between the replacement gate structures 175 and S/D contacts 200 to be engineered in order to lower the parasitic gate-to-S/D capacitance to target values needed for RF technologies, i.e., lowering the gate to drain capacitance ($C_{gd}$) and gate to source capacitance ($C_{gs}$). In embodiments, forming the relatively large air spacer structures 220 allows for these RF target values, e.g., Ft and Fmax of RF transistors, to be achieved due to Ft and Fmax being inversely proportional to values of gate structure to S/D contact capacitances $C_{gd}$ and $C_{gs}$. Further, the processes and structures described herein are compatible with non-self-aligned contact (SAC) flow and can be applied to any contacted poly pitch (CPP), which can be critical for RF FinFETs, for example. In this way, the structures and processes described herein improve the overall performance of RF devices at any CPP.

The structures and processes described herein are compatible with the process of record integration flow and relatively larger CPPs in general. Further, the structures and processes described herein address parasitic gate-to-S/D capacitance caused by relatively low quality oxide flowable chemical vapor deposition (FCVD) between the gate stack 180 and gate cap 185 of the replacement gate structures 175 and the metal material 205 of the S/D contacts 200. By removing the low quality FCVD oxide of these RF devices with relaxed CPP and forming an airgap instead, the parasitic capacitances can be significantly reduced, and the overall RF performances improved. Additionally, the structures and processes described herein are not limited to having small airgaps formed only within the sidewall spacers 135 of the replacement gate structures 175; instead, the structures and processes described herein allow for relatively large air spacer structures 220 adjacent to the sidewall spacers 135 of the replacement gate structures 175.

Figure 10A:
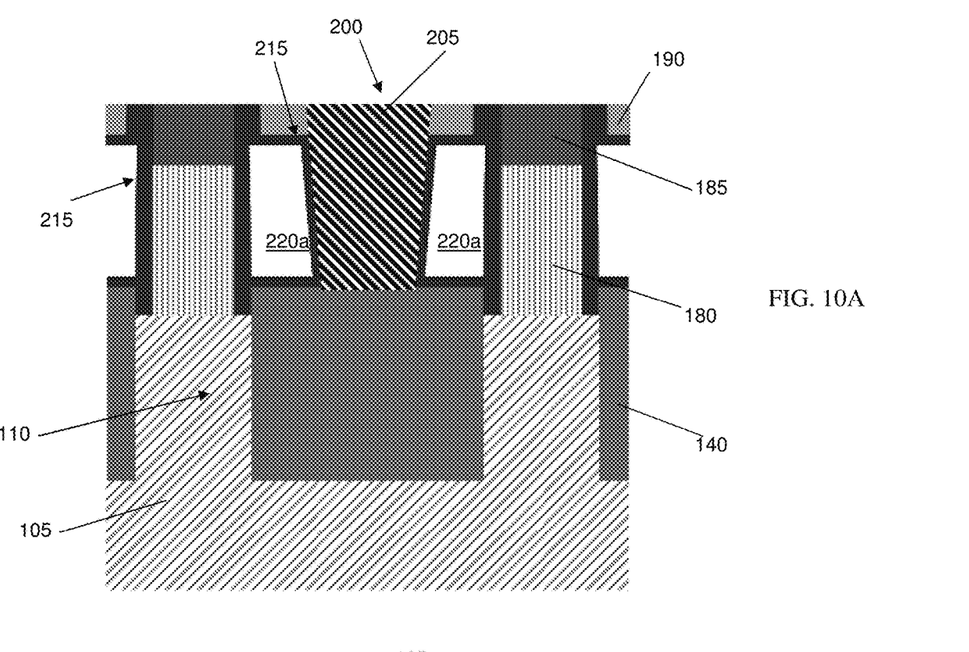
Figure 10B:
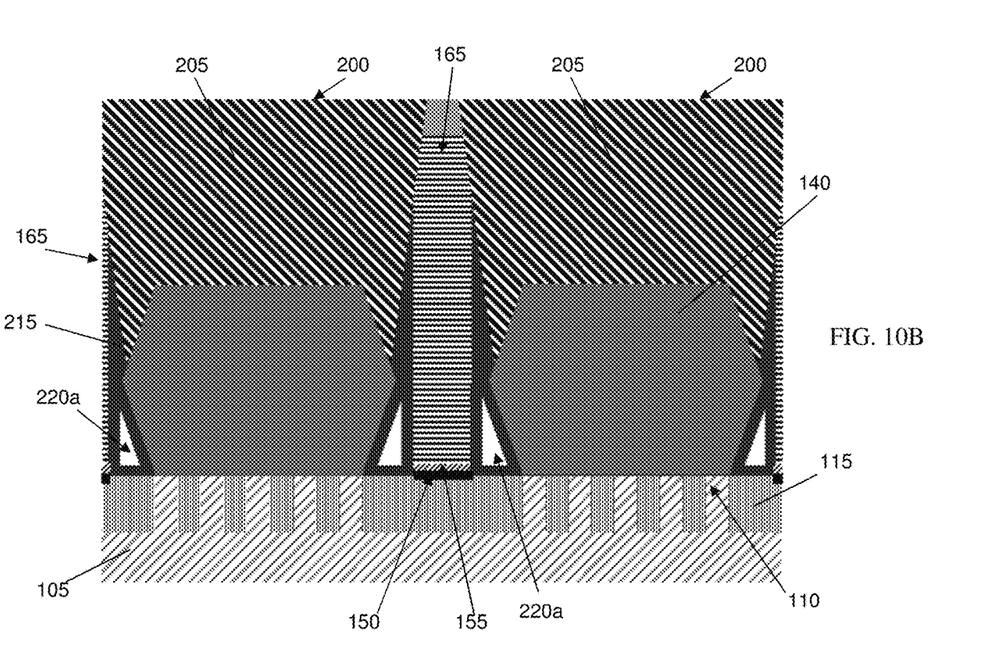

FIGS. 9A-10B show alternative structures in accordance with aspects of the present disclosure. Similar to the processes described within FIGS. 1A-8B, FIGS. 9A and 9B show the removal of the bottom liner 150 and the sidewall spacers 135 of the replacement gate structures 175, in addition to the removal of the top liner 155 illustrated in FIGS. 7A and 7B. Accordingly, the airgaps 210a are larger than the airgaps 210 of FIGS. 7A and 7B. In this way, the air spacer structures 220a shown in FIGS. 10A and 10B are relatively larger than the air spacer structures 220 of FIGS. 8A and 8B due to the increased size of the airgaps 210 created by removal of the bottom liner 150 and the sidewall spacers 135. In this way, the processes described herein include forming at least one gate structure 175 and forming a plurality of active regions, i.e., S/D regions 140, adjacent to the at least one gate structure 175. Further, the process includes forming a dual liner, i.e., dual CESL liner 145, encapsulating the at least one gate structure and the active regions, and depositing an insulator material, i.e., ILD 160, over the dual liner.

Additionally, the process includes forming a plurality of anchor structures 165 between the active regions and forming a plurality of contacts 200 in electrical contact with the active regions. In embodiments, the process concludes with etching at least one liner, i.e., bottom liner 150 or top liner 155, of the dual liner, etching select portions of the insulator material to form at least one airgap 210, and depositing a second liner, i.e., low-k liner 215, within the airgaps 210 to form air spacer structures. In further embodiments, the etching the at least one liner is a top liner 155 of the dual liner.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
a plurality of gate structures comprising active regions;
contacts extending to the active regions;
a plurality of anchor structures between the active regions; and
air spacer structures adjacent to the contacts,
wherein:
upper surfaces of the anchor structures are lower than upper surfaces of the contacts and the gate structures;
the contacts are anchored into the anchor structures;
the air spacer structures comprise airgaps between the gate structures and the contacts;
the air spacer structures comprise a low-k liner;
the gate structures comprise sidewall spacers and a etch stop liner adjacent to the sidewall spacers;
the etch stop liner extends beneath the anchor structures;
the etch stop liner is a dual etch stop liner comprising a bottom liner and a top liner; and
each of the air space structure includes an upper airgap and a lower airgap separated from one another by the low-k liner.

2. The structure of claim 1, wherein a low-k liner lines the anchor structures.

3. The structure of claim 1, wherein the bottom liner and the top liner are composed of a low-k material.

4. The structure of claim 1, further comprising a cap over the air spacer structures.

5. The structure of claim 4, wherein the cap is composed of a same material as the anchor structures.

6. A structure, comprising:
a plurality of gate structures comprising source and drain (S/D) regions;
contacts extending to the S/D regions;
a plurality of anchor structures located between the S/D regions and between the contacts to separate adjacent ones of the S/D regions and adjacent ones of the contacts from one another; and
air spacer structures adjacent to sidewalls of the S/D regions, sidewalls of the contacts and sidewalls of the anchor structures,
wherein:
the air spacer structures separate the sidewalls of the S/D regions from the sidewalls of the anchor structures;
the contacts are anchored into the anchor structures;
the air spacer structures comprise airgaps between the gate structures and the contacts;
upper surfaces of the anchor structures are lower than upper surfaces of the contacts and the gate structures;
the air spacer structures comprise a low-k liner;
the gate structures comprise sidewall spacers and a etch stop liner adjacent to the sidewall spacers;
the etch stop liner extends beneath the anchor structures;
the etch stop liner is a dual etch stop liner comprising a bottom liner and a top liner; and
each of the air space structure includes an upper airgap and a lower airgap separated from one another by the low-k liner.

7. A method, comprising:
forming a plurality of gate structures comprising active regions;
forming contacts extending to the active regions;
forming a plurality of anchor structures between the active regions; and
forming air spacer structures adjacent to the contacts,
wherein:
upper surfaces of the anchor structures are lower than upper surfaces of the contacts and the gate structures;
the contacts are anchored into the anchor structures;
the air spacer structures comprise airgaps between the gate structures and the contacts;
upper surfaces of the contacts and the gate structures are devoid of the anchor structures;
the air spacer structures comprise a low-k liner;
the gate structures comprise sidewall spacers and a etch stop liner adjacent to the sidewall spacers;
the etch stop liner extends beneath the anchor structures;
the etch stop liner is a dual etch stop liner comprising a bottom liner and a top liner; and
each of the air space structure includes an upper airgap and a lower airgap separated from one another by the low-k liner.

8. The method of claim 7, wherein etching the at least one liner is a top liner of the dual liner.

* * * * *